(12) United States Patent
Taniguchi et al.

(10) Patent No.: US 8,085,115 B2
(45) Date of Patent: Dec. 27, 2011

(54) PIEZOELECTRIC THIN FILM RESONATOR, FILTER, AND COMMUNICATION APPARATUS

(75) Inventors: Shinji Taniguchi, Kawasaki (JP); Tokihiro Nishihara, Kawasaki (JP); Tsuyoshi Yokoyama, Kawasaki (JP); Masafumi Iwaki, Kawasaki (JP); Motoaki Hara, Kawasaki (JP); Masanori Ueda, Kawasaki (JP)

(73) Assignee: Taiyo Yuden Co., Ltd, Tokyo (JP)

( * ) Notice: Subject to any disclaimer, the term of this patent is extended or adjusted under 35 U.S.C. 154(b) by 365 days.

(21) Appl. No.: 12/397,932

(22) Filed: Mar. 4, 2009

(65) Prior Publication Data

US 2010/0060385 A1    Mar. 11, 2010

(30) Foreign Application Priority Data

Mar. 6, 2008 (JP) .................... 2008-056261

(51) Int. Cl.
*H03H 9/54* (2006.01)
*H03H 9/13* (2006.01)
*H03H 9/15* (2006.01)

(52) U.S. Cl. ........ 333/187; 333/189; 333/133; 310/324; 310/365

(58) Field of Classification Search .................. 333/133, 333/187–192; 310/322, 324, 365
See application file for complete search history.

(56) References Cited

U.S. PATENT DOCUMENTS

| | | | |
|---|---|---|---|
| 6,060,818 A | 5/2000 | Ruby et al. | |
| 6,384,697 B1 | 5/2002 | Ruby | |
| 7,212,082 B2 * | 5/2007 | Nagao et al. | 333/187 |
| 7,301,260 B2 * | 11/2007 | Kawakubo | 310/324 |
| 7,482,738 B2 | 1/2009 | Taniguchi et al. | |
| 7,602,101 B2 * | 10/2009 | Hara et al. | 310/320 |
| 7,816,998 B2 * | 10/2010 | Hara et al. | 333/187 |
| 2005/0110369 A1 * | 5/2005 | Onishi et al. | 310/320 |
| 2005/0264137 A1 * | 12/2005 | Taniguchi et al. | 310/324 |
| 2006/0244553 A1 * | 11/2006 | Yokoyama et al. | 333/191 |
| 2007/0096597 A1 | 5/2007 | Taniguchi et al. | |
| 2008/0179995 A1 * | 7/2008 | Umeda et al. | 310/324 |

FOREIGN PATENT DOCUMENTS

| | | |
|---|---|---|
| CN | 1956324 A | 5/2007 |
| EP | 0 963 040 A2 | 12/1999 |
| GB | 2 367 436 A | 4/2002 |
| JP | 6-40611 B2 | 5/1994 |
| JP | 2000-069594 A | 3/2000 |
| JP | 2002-140075 A | 5/2002 |
| JP | 2005-45694 * | 2/2005 |

OTHER PUBLICATIONS

K. Nakamura et al, "Diaphragm Composite Resonator on a Silicon Wafer", Electronic Letters, Jul. 9, 1981, pp. 507-509, vol. 17, No. 14.

* cited by examiner

*Primary Examiner* — Barbara Summons
(74) *Attorney, Agent, or Firm* — Arent Fox, LLP

(57) ABSTRACT

A piezoelectric thin film resonator includes a substrate, a lower electrode formed on the substrate, a piezoelectric film formed on the substrate and the lower electrode, and an upper electrode formed on the piezoelectric film and opposing the lower electrode, an upper electrode formed on the piezoelectric film. The upper electrode has a main portion and an extended portion connected to the main portion, the main portion opposing the lower electrode and an opening disposed between the substrate and the lower electrode, the extended portion having a portion which opposes the opening and the substrate.

14 Claims, 13 Drawing Sheets

PIEZOELECTRIC THIN FILM RESONATOR, FILTER, AND COMMUNICATION APPARATUS

CROSS-REFERENCE TO RELATED APPLICATIONS

This application is based upon and claims the benefit of priority of the prior Japanese Patent Application No. 2008-056261, filed on Mar. 6, 2008, the entire contents of which are incorporated herein by reference.

FIELD

The present invention relates to a piezoelectric thin film resonator based on a function of conversion between an electrical signal and a bulk acoustic wave performed by a piezoelectric thin film resonator. The present invention also relates to a filter formed of connection of a plurality of piezoelectric thin film resonators. The present invention also relates to a communication apparatus including the filter.

BACKGROUND

A rapid and widespread use of radio apparatus such as cellular phones has increased a demand for down-sized and light-weight resonators, and filters manufactured of a combination of such resonators. In these apparatus, dielectric filters and surface acoustic wave (SAW) filters have been mainly used. Recently, filters manufactured of piezoelectric thin film resonators draw attention, because the piezoelectric thin film resonator features a low loss in a high-frequency region, high power durability, excellent Electrostatic Discharge (ESD) characteristics, and permits a small size and a monolithic design.

Film Bulk Acoustic Resonator (FBAR) type resonator is known as one of such piezoelectric thin film resonators. This resonator includes as a main element a laminated structure composed of a lower electrode, a piezoelectric layer, and an upper electrode, and an opening (via hole or cavity) is located beneath a portion (membrane region) of the lower electrode where the lower electrode faces the upper electrode.

If an electrical signal of a high frequency is applied between the upper electrode and the lower electrode, an acoustic wave is excited within the piezoelectric film between the upper electrode and the lower electrode by the inverse piezoelectric effect. Conversely, the piezoelectric effect converts a distortion caused by the acoustic wave into an electrical signal. Since the acoustic wave is totally reflected from each surface of the upper and the lower electrodes in contact with air, the acoustic wave is transformed into a vibration in a thickness longitudinal mode in which a main displacement is in the direction of thickness of the piezoelectric layer. In such a structure, assuming that a thickness H is a total thickness of the thin film structure having as a main element the upper electrode, piezoelectric film, lower electrode formed on the opening, a resonance takes place at a frequency where the thickness H is equal to an integer multiple (n times) of a ½ wavelength of the acoustic wave. Let V represent a propagation velocity of the acoustic wave determined by a material, a resonance frequency F is written as $F=nV/2H$. Accordingly, a resonator having desired frequency characteristics is produced by controlling the resonance frequency by the thickness on the basis of the resonance phenomenon, and a filter is produced by connecting a plurality of resonators.

The electrode can be manufactured of one selected from or a combination of aluminum (Al), copper (Cu), molybdenum (Mo), tungsten (W), tantalum (Ta), platinum (Pt), ruthenium (Ru), rhodium (Rh), iridium (Ir), chromium (Cr), titanium (Ti), etc. The combination is preferable to be used in a laminated form.

Silicon, glass, GaAs, or the like may be used for a substrate. In case of Si as the substrate, the opening may be formed by etching (wet etching or dry etching) a rear side of the Si substrate, or by wet etching a sacrificial layer formed on a front side of the Si substrate. In this specification, a hole penetrating from the rear side of the substrate through to the front side of the substrate is referred to as a "via hole" and the opening presents right beneath the lower electrode in the vicinity of the front side of the substrate is referred to as a "cavity or opening." The known piezoelectric thin film resonators are divided into a via-hole type and a cavity type.

FIG. 20 is a sectional view of a known via-hole type piezoelectric thin film resonator. The structure illustrated in FIG. 20 is an example of a piezoelectric thin film resonator, and is disclosed in Electron. Lett., 17 (1981), pp. 507-509. In this structure, a lower electrode of Au—Cr 22, a piezoelectric film of ZnO 23, and an upper electrode of Al 24 are formed on a (100) Si substrate 21 having a thermally oxidized layer ($SiO_2$) 25. The via hole 26 is formed by performing an isotropic etching operation on the rear side of the Si substrate 21 using KOH aqueous solution or EDP aqueous solution (mixture of ethylenediamine, pyrocatechol, and water).

On the other hand, FIG. 21 is a sectional view of a cavity-type piezoelectric thin film resonator In the cavity-type piezoelectric thin film resonator, an upper electrode 34, piezoelectric film 33, and lower electrode 32 are formed as main elements on a sacrificial layer 35, and a cavity is finally formed by removing the sacrificial layer through etching. The piezoelectric thin film resonator illustrated in FIG. 21 is disclosed in Japanese Laid-open Patent Publication No. 6-40611. In this example, an island-like sacrificial pattern of ZnO is formed as a sacrificial layer, and a laminated structure composed of a dielectric film, upper electrode, piezoelectric film, lower electrode, and dielectric film is produced on the sacrificial pattern, and the sacrificial layer is then removed by acid to form the cavity (air bridge structure).

With reference to FIG. 22, Japanese Laid-open Patent Publication No. 2000-69594 discloses a piezoelectric thin film resonator in which a recess is formed on the front side of a substrate below a laminated region composed of an upper electrode, a piezoelectric film, and a lower electrode. In the piezoelectric thin film resonator illustrated in FIG. 22, a sacrificial layer 45 is deposited on a recess formed beforehand, the surface of the substrate 41 is then planarized. Then the laminated structure composed of the upper electrode 44, the piezoelectric film 43, the lower electrode 42 is formed on the planarized substrate 41, and finally the sacrificial layer is removed by etching in order to form the cavity.

Aluminum nitride (AlN), zinc oxide (ZnO), lead zirconate titanate (PZT), lead titanate ($PbTiO_3$), and the like may be used for the piezoelectric film. In many cases, AlN is used from the standpoint of sound speed, temperature characteristics, quality value (Q value), and ease of film formation. In particular, the formation of the AlN film having crystallization highly oriented in c-axis (in a direction vertical to the surface of the lower electrode) is one of important factors in the determination of resonance characteristics and directly affects a coupling coefficient and Q value. On the other hand, the formation of the AlN film having crystallization highly oriented in c-axis needs a high-level energy to be applied during the film formation. For example, substrate heating needs to be performed at 1000° C. or higher in metal organic chemical vapor deposition (MOCVD), and substrate heating needs to be performed at 400° C. or higher in addition to power for plasma in plasma enhanced chemical vapor deposition (PECVD). With sputtering technique, substrate temperature rising due to sputtering to an insulating film is known. For this reason, the AlN film has generally a strong film stress (a remaining stress). As a result, a piezoelectric thin film resonator including the AlN film having crystallization highly oriented in c-axis suffers from problems such as an open-circuit at a leading part from the upper electrode and membrane destruction. In the piezoelectric thin film resonator, the cavity is preferably designed to include a membrane region so that resonance is properly performed, because an acoustic wave resonates in the membrane region.

Techniques to move a lower electrode from within a cavity to outside the cavity on a substrate have been introduced to overcome the problem of a degradation in mechanical strength (disclosed in Japanese Laid-open Patent Publication No. 2002-140075)

Although the structure disclosed in Japanese Laid-open Patent Publication No. 2002-140075 still suffers from the trade-off relationship that mechanical strength and Q value are improved while a drop in an electromechnical coupling coefficient is unavoidable.

SUMMARY

According to an aspect of the invention, a piezoelectric thin film resonator includes a substrate, a lower electrode formed on the substrate, a piezoelectric film formed on the substrate and the lower electrode, and an upper electrode formed on the piezoelectric film. The upper electrode has a main portion and an extended portion connected to the main portion, the main portion opposing the lower electrode and an opening disposed between the substrate and the lower electrode, the extended portion having a portion which opposes the opening and the substrate.

According to another aspect of the invention, a piezoelectric thin film resonator includes a substrate, a lower electrode formed on a major flat surface of the substrate, a piezoelectric film formed on the substrate and the lower electrode, an upper electrode formed on the piezoelectric film, and a gap below a portion of the lower electrode corresponding to a membrane where the upper electrode and the lower electrode overlap each other with the piezoelectric film interposed therebetween, wherein a center portion of a leading part (or an extended part) of the upper electrode in contact with the membrane is formed above the gap, and wherein the opposed ends of the leading part of the upper electrode are formed outside the gap.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
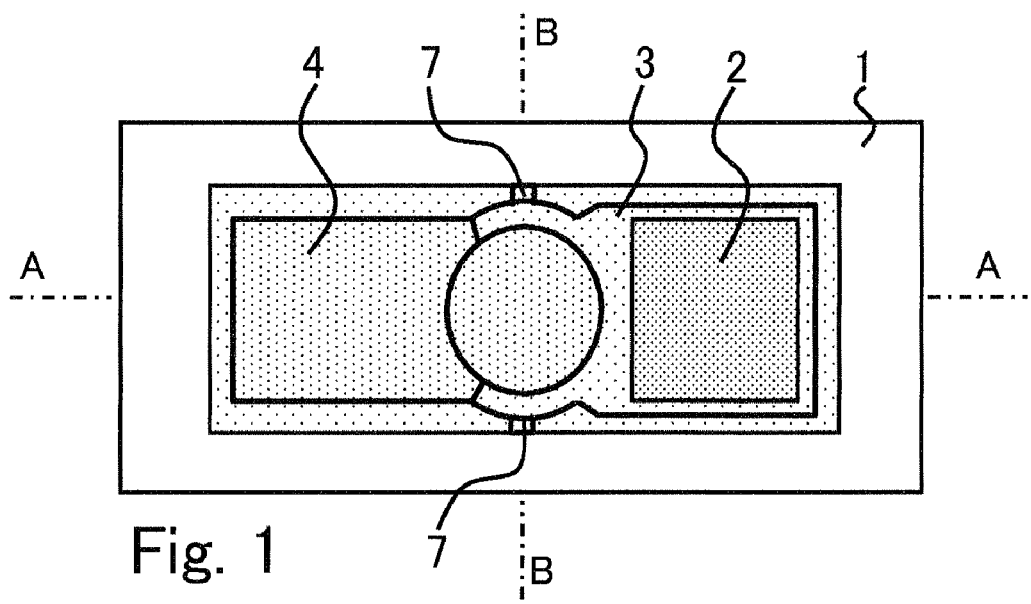
FIG. 1 illustrates a plan view showing a structure of a first embodiment of a piezoelectric thin film resonator of the present invention.

A first embodiment of a piezoelectric thin film resonator of the present invention includes a substrate, a lower electrode formed on the substrate, a piezoelectric film formed on the substrate and the lower electrode, an upper electrode formed on the piezoelectric film, and a cavity (such as an opening, a via hole, a recess, or a gap) below a portion of the lower electrode corresponding to a membrane where the upper electrode and the lower electrode overlap each other with the piezoelectric film interposed therebetween, wherein a center portion of an extensional part of the upper electrode in contact with the membrane is formed above the cavity, and wherein the opposed ends of the leading part of the upper electrode are formed outside the opening. This arrangement provides the piezoelectric thin film resonator with the mechanical strength thereof increased and the resonance characteristics thereof maintained. The piezoelectric thin film resonator excellent in productivity is thus provided.

A second embodiment of a piezoelectric thin film resonator of the present invention includes a substrate, a lower electrode formed on a major flat surface of the substrate, a piezoelectric film formed on the substrate and the lower electrode, an upper electrode formed on the piezoelectric film, and a cavity below a portion of the lower electrode corresponding to a membrane where the upper electrode and the lower electrode overlap each other with the piezoelectric film interposed therebetween, wherein a center portion of a leading part of the upper electrode in contact with the membrane is formed above the cavity, and wherein the opposed ends of the leading part of the upper electrode are formed outside the cavity. This arrangement provides the piezoelectric thin film resonator with the mechanical strength thereof increased and the resonance characteristics thereof maintained. The piezoelectric thin film resonator excellent in productivity is thus provided.

The embodiments of the piezoelectric thin film resonator are embodied in the following arrangements on the basis of the above-described structure.

In the piezoelectric thin film resonator, a planar shape of the cavity at the end portion of the lower electrode may have the same planar shape as the end portion of the lower electrode. With this arrangement, the mechanical strength is improved while the resonance characteristics are maintained. A piezoelectric thin film resonator excellent in productivity is thus provided.

In the piezoelectric thin film resonator, the stress of a laminated film formed by laminating, the lower electrode, the piezoelectric film, and the upper electrode on the substrate is preferably a compressive stress. With this arrangement, the cavity is produced between laminated films formed on the substrate with a good repeatability. The destruction of the cavity is controlled.

In the piezoelectric thin film resonator of the present invention, an area where the upper electrode faces the lower electrode may have an elliptic shape or a polygonal shape having no parallel sides. With the facing area of the upper electrode and the lower electrode being an elliptic shape, an elastic (acoustic) wave reflected from the end portion (or an edge) of the electrodes and the outer circumference (or the outer edge) of the piezoelectric film is prevented from being present as a standing wave in a transversal direction in a resonance section (in a direction parallel to the surface of the substrate). With this arrangement, the generation of ripples in the passband is controlled. With the facing area of the upper electrode and the lower electrode being a polygonal shape having no parallel sides, an acoustic wave reflected from the end portion of the electrodes and the outer circumference of the piezoelectric film is prevented from being present as a standing wave in a transversal direction in the resonance section. With this arrangement, the generation of ripples in the passband is controlled.

In the piezoelectric thin film resonators of the embodiments, the piezoelectric film is manufactured of a material containing aluminum nitride or zinc oxide as a main component.

Embodiments

1. First Embodiment of the Piezoelectric Thin-film Resonator

Figure 2:
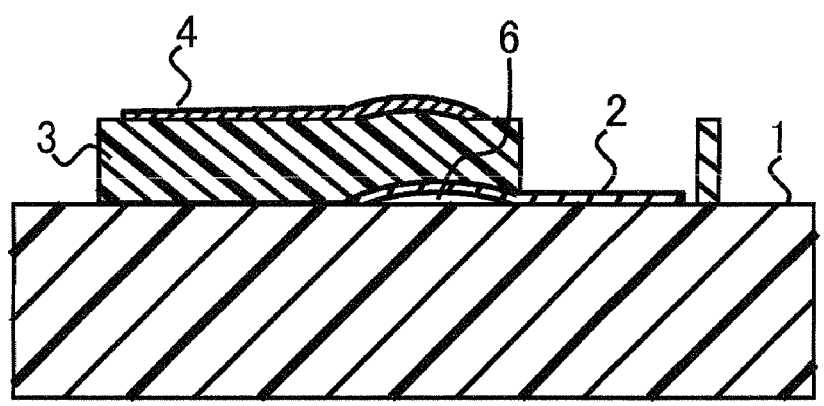
FIG. 2 illustrates a sectional view taken along line A-A in FIG. 1.
Figure 3:
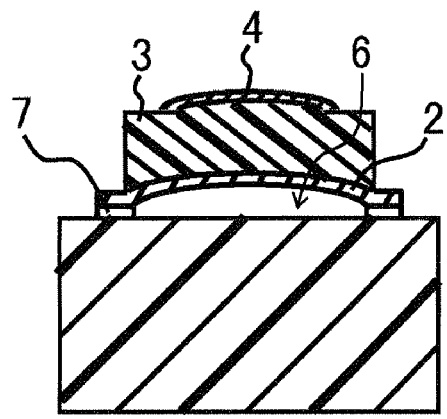
FIG. 3 illustrates a sectional view taken along line B-B in FIG. 1.

FIG. 1 is a plan view illustrating a structure of a piezoelectric thin film resonator of a present embodiment. FIG. 2 is a sectional view taken along line A-A in FIG. 1. FIG. 3 is a sectional view taken along line B-B in FIG. 1. Here, a substrate 1 is a Si substrate having a major flat surface. A lower electrode 2 is manufactured of a Ru film (having a thickness of 260 nm). The substrate 1 may be a quartz substrate instead of the Si substrate. A substrate having difficulty in forming via holes may also be used. If the substrate 1 is a substrate having difficulty in forming via holes, the same structure as the present embodiment is constructed by forming a dome-shaped air gap (cavity) between the substrate 1 and the lower electrode. A piezoelectric film 3 is constructed of an AlN film (having a thickness of 1200 nm). An upper electrode 4 is constructed of a Ru film (having a thickness of 260 nm).

In a region (membrane region) where the upper electrode 4 and the lower electrode 2 face each other with the piezoelectric film 3 interposed therebetween, an cavity 6 bulging like a dome (such as a dome-shaped air gap) is formed between the underside of the lower electrode 2 and the top surface of the substrate 1 (see FIG. 2). In accordance with the present embodiment, the planar shape of the cavity 6 is set to be elliptic, and the upper electrode 4 and the lower electrode 2 overlap each other and form the generally elliptic planar shape (see FIG. 1). The cavity 6 can be formed by removing a sacrificial layer patterned beforehand beneath the lower electrode 2 for the formation of the lower electrode 2. Also, etchant supply mouths 7 for sacrificial layer etching are arranged on the substrate 1 to form the cavity 6 to etch the sacrificial layer.

Figure 4:
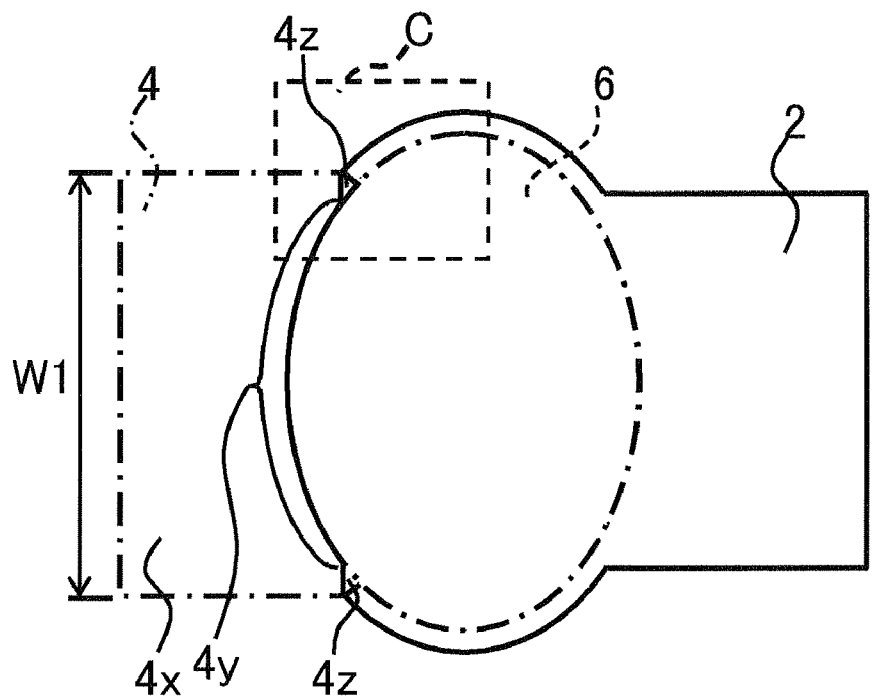
FIG. 4 illustrates a plan view showing the structure of the first embodiment of the piezoelectric thin film resonator.
Figure 5:
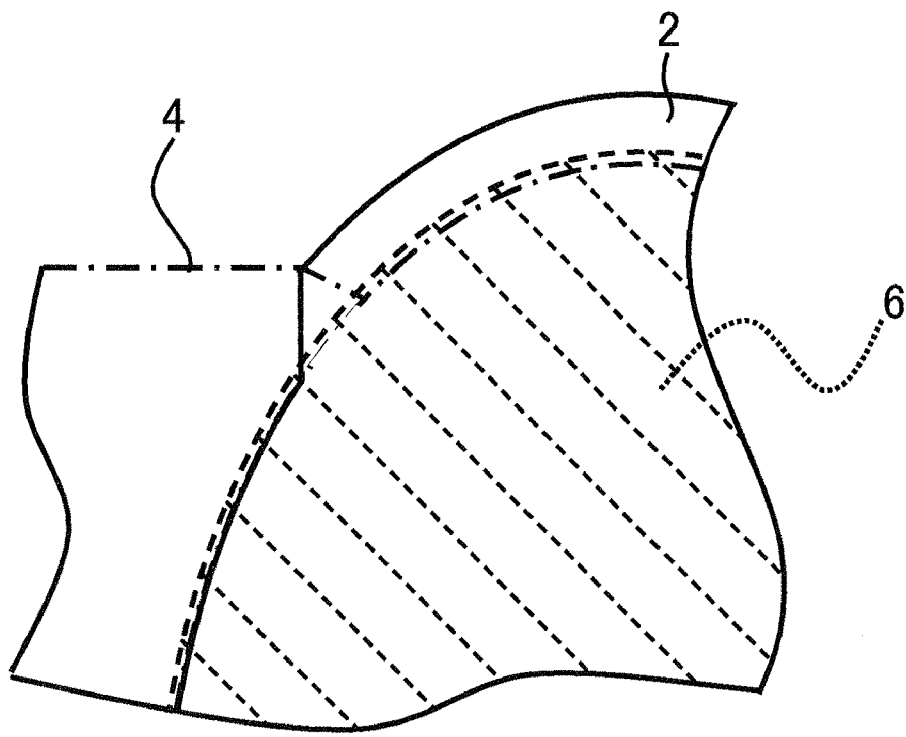
FIG. 5 illustrates an expanded view of a C portion in FIG. 4.

FIG. 4 is a plan view explaining the relationship of the lower electrode 2, the upper electrode 4 and the cavity 6 in the piezoelectric thin film resonator illustrated in FIG. 1. As illustrated in FIG. 4, the substrate 1, the piezoelectric film 3, the etchant supply mouths 7 for sacrificial layer etching, and the like are omitted for sake of simplicity. FIG. 5 is an expanded view of a C portion in FIG. 4. As illustrated in FIG. 5, a hatched area represents the cavity 6 beneath the lower electrode 2. Also as illustrated in FIG. 5, a dashed-dotted line, a solid line, and a broken line represent the outlines of the upper electrode 4, the lower electrode 2, and the outline of the cavity 6, respectively.

Figure 6A:
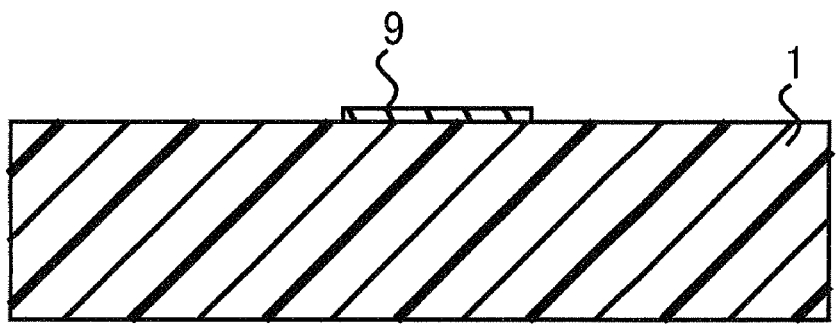
FIGS. 6A to 6C illustrate sectional views showing a manufacturing process of the piezoelectric thin film resonator.
Figure 6B:
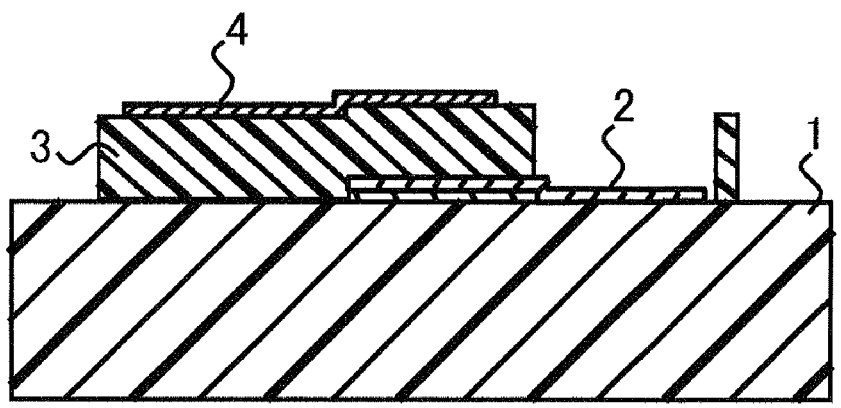
Figure 6C:
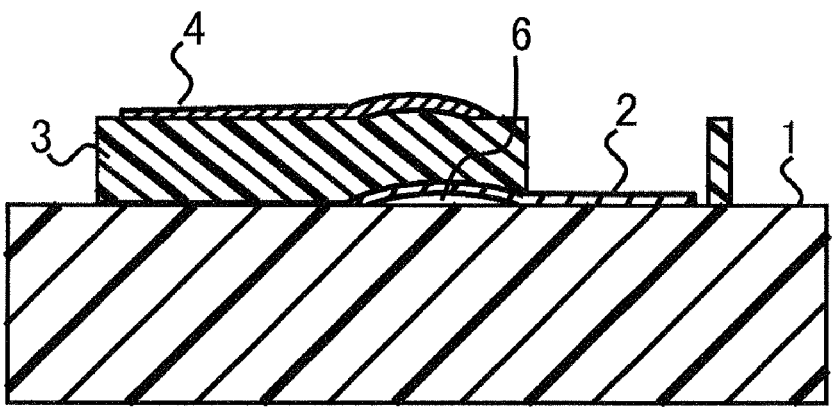

FIGS. 6A to 6C illustrate a manufacturing process of the piezoelectric thin film resonator illustrated in FIG. 1 through FIG. 5. Each of the drawings is illustrated as sectional views taken along line A-A in FIG. 1.

First, as shown in FIG. 6A, a film of magnesium oxide (MgO) of a thickness within a range of from 20 to 100 nm serving as a sacrificial layer 9 is formed on the Si substrate 1 (or quartz substrate) using a sputtering technique or vacuum deposition. The sacrificial layer 9 is not limited to MgO and may be one of zinc oxide (ZnO), germanium (Ge), titanium (Ti), silicon dioxide (SiO2), and the like. The sacrificial layer 9 is not limited to any particular material as long as the material is easily dissolved by an etchant. Next, the sacrificial layer 9 is patterned to a desired shape through a photolithography technique and an etching process. Here, the sacrificial layer 9 is patterned to an elliptic shape generally identical to the shape of a region (membrane region) where the upper electrode 4 and the lower electrode 2 overlap each other.

Referring to FIG. 6B, the lower electrode 2, the piezoelectric film 3, and the upper electrode 4 are successively formed. The lower electrode 2 is formed by sputtering in an argon (Ar) atmosphere under a pressure of 0.6 to 1.2 Pa and patterned to a desired shape using the photolithography technique and the etching process. In succession, a film of AlN for the piezoelectric film 3 is formed through the sputtering process with an Al target in an Ar and $N_2$ mixed gas atmosphere of a pressure of about 0.3 Pa. Next, a film of Ru for the upper electrode 4 is formed on the film of AlN by sputtering in the Ar gas atmosphere under a pressure of 0.6 to 1.2 Pa. The films thus laminated are subjected to the photolithography technique and the etching process (wet etching or dry etching) in order to pattern the upper electrode 4 and the piezoelectric film 3 to a desired shape. Sputtering conditions described herein are examples only, and are set so that the laminated film constructed of the lower electrode 2, the piezoelectric film 3 and the upper electrode 4 has a compressive stress. A center portion 4y, which is shown by a curved bracket to show the area of the center portion, of a leading portion 4x (or a leading part 4x) of the upper electrode 4 in contact with the membrane region is formed on the cavity 6 to be formed in a next step. Opposed end portions 4z of the leading part 4x of the upper electrode 4 are formed to be outside the cavity 6 (see FIG. 4).

Next, referring to FIG. 6C, the etchant supply mouths 7 are formed in the lower electrode 2 using the photolithography technique of resist pattern (see FIG. 3). An etchant is applied toward the sacrificial layer 9 via the etchant supply mouths 7, and the sacrificial layer 9 is removed through the etching process to form the cavity 6. The etchant supply mouths 7 may be formed during the lower electrode 2 is etched. The stress caused in the laminated film constructed of the lower electrode 2, the piezoelectric film 3, and the upper electrode 4 is designed to be a compressive stress. To satisfy such a stress condition in the laminated film, the laminated film bulges at the end of the etching process of the sacrificial layer 9, and a dome-shaped cavity 6 such as a dome-shape air gap thus formed between the lower electrode 2 and the substrate 1 (see FIG. 6C).

Under the above-described sputtering conditions, the stress in the laminated film was approximately (minus) 300 MPa compressive stress. The sputtering conditions described herein are examples only, and making the stress of the laminated film a compressive stress is important to produce a dome-shape gap. A variety of combinations of sputtering conditions are possible. Using another film forming method, a dome-shaped air gap can be produced by adjusting the stress of the laminated film.

Figure 7A:
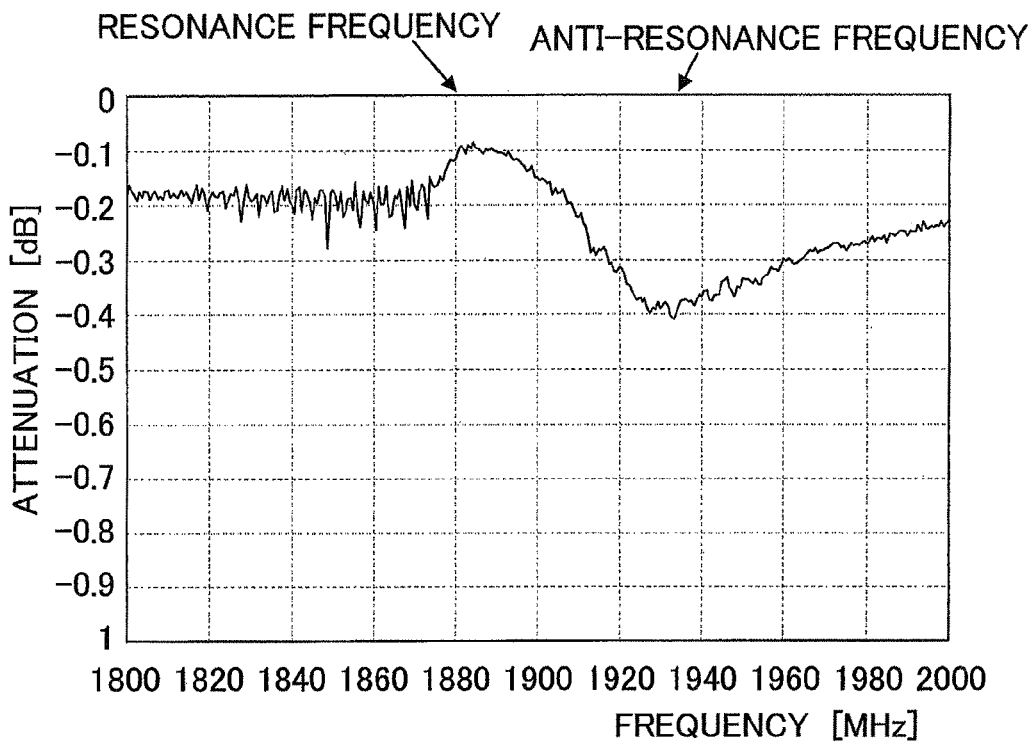
FIG. 7A illustrates a characteristic diagram showing frequency characteristics of the piezoelectric thin film resonator of the first embodiment.
Figure 7B:
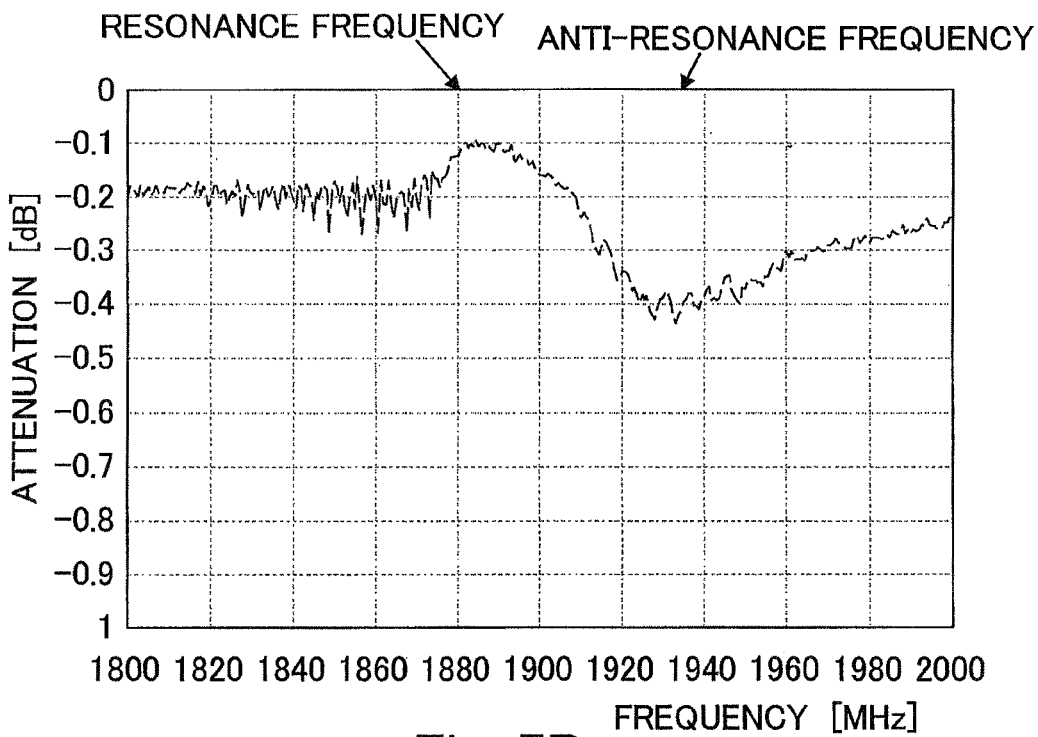
FIG. 7B illustrates a characteristic diagram showing frequency characteristics of the piezoelectric thin-film resonator of known structure.
Figure 8:
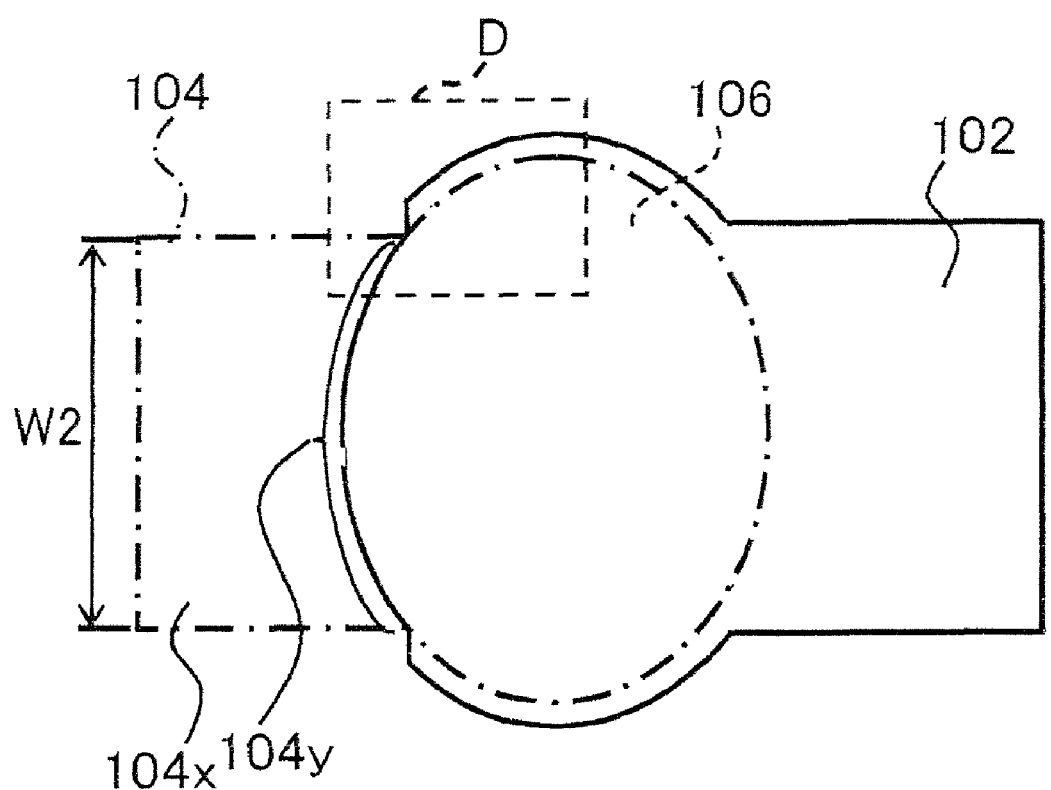
FIG. 8 illustrates a plan view of the known piezoelectric thin film resonator.
Figure 9:
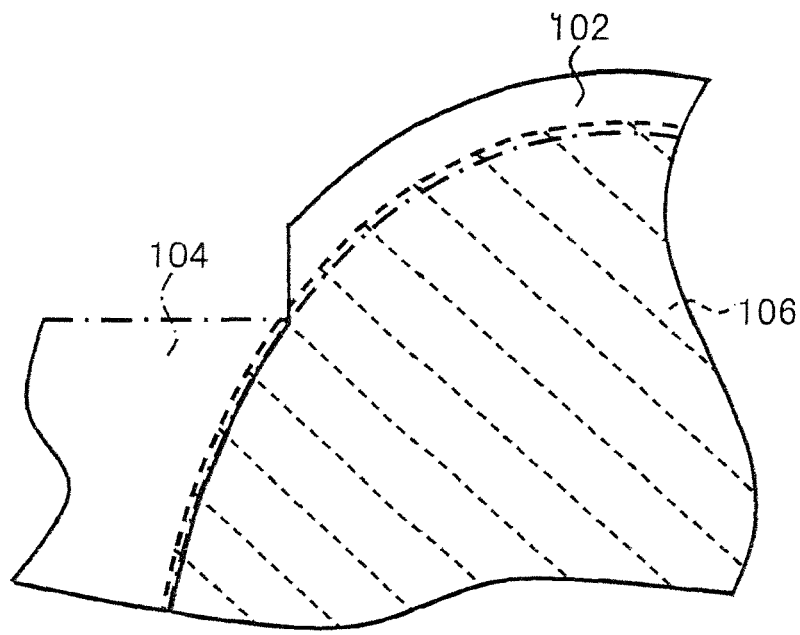
FIG. 9 illustrates an expanded view of a D portion in FIG. 8.

FIG. 7A illustrates resonance characteristics of the piezoelectric thin film resonator produced in accordance with the production method illustrated in FIGS. 6A to 6C. To compare the present embodiment with the known art, a characteristic chart illustrated in FIG. 7B illustrates characteristics of a resonator of known structure illustrated in FIGS. 8 and 9. In comparison, the known piezoelectric thin film resonator illustrated in FIGS. 8 and 9 is different from the piezoelectric thin film resonator of the present embodiment illustrated in FIGS. 4 and 5 in that the entire leading part 104x of an upper electrode 104 is formed on a cavity 106. FIG. 9 is an expanded view of a D portion in FIG. 8. With reference to FIG. 9, a dashed-dotted line represents the outline of the upper electrode 104, a solid line represents the outline of a lower electrode 102, and a broken line represents the outline of the gap 106. In each of the structures of the present embodiment and the known art, the region where the lower electrode and the upper electrode face each other has an elliptic shape, having a length of major axis: 245 μm and a length of minor axis: 175 μm.

Referring to FIGS. 7A and 7B, the ordinate of the graph represents a return loss of one-port characteristics, in which the closer to 0 dB the loss, the smaller the loss, and the higher the quality factor Q of the resonator. The comparison of the two resonators shows that the resonator having the structure of FIGS. 4 and 5 with a mechanical strength improvement step incorporated provides characteristics equal to those of the known resonator. The resonator of the present embodiment includes the upper electrode 4 (see FIG. 4) having a leading part 4x with a width W1 thereof larger than that (width W2 of the leading part 104x in FIG. 8) in the known resonator. An electrode resistance is reduced, and the quality factor Q in the resonance frequency is slightly increased.

Figure 10:
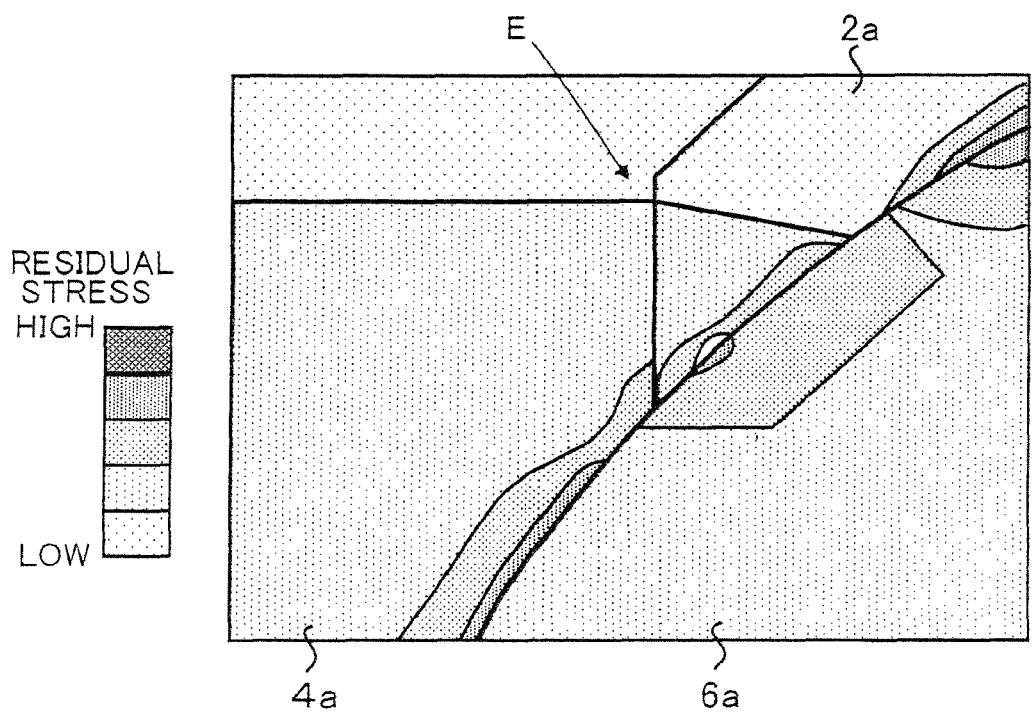
FIG. 10 illustrates a distribution chart showing a stress distribution of the piezoelectric thin film resonator illustrated in FIG. 5.
Figure 11:
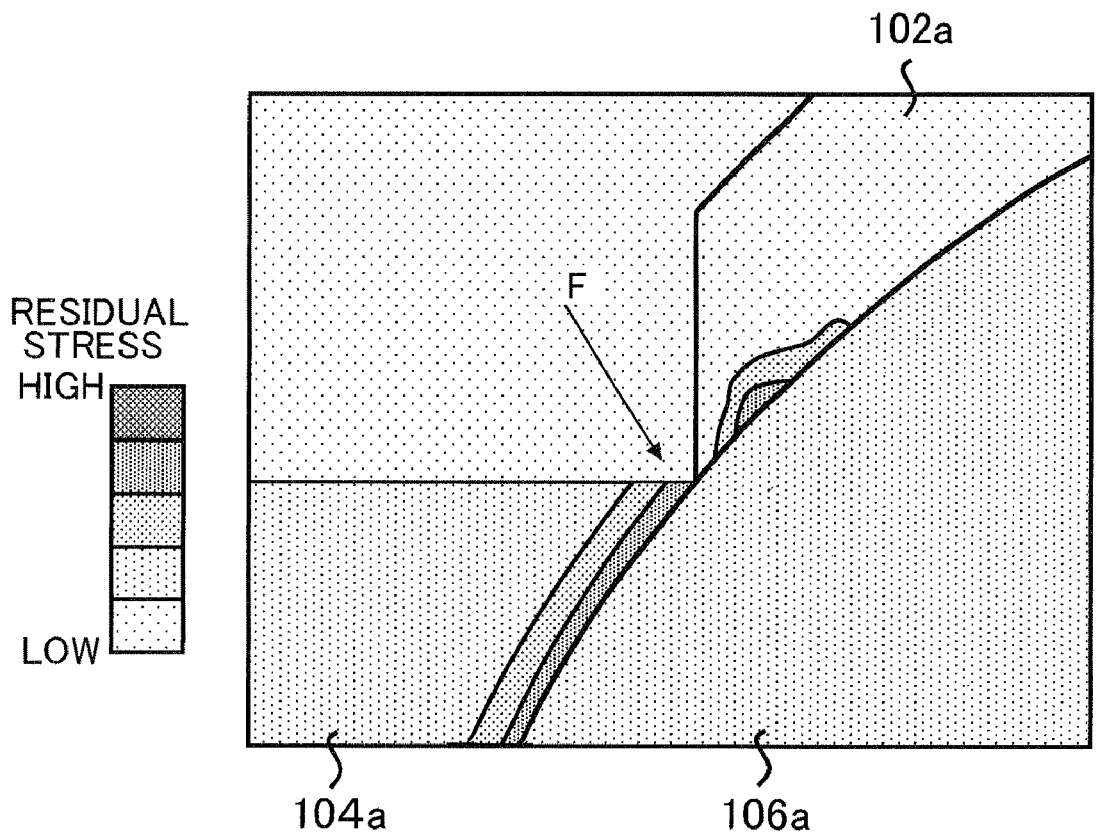
FIG. 11 illustrates a distribution chart showing a stress distribution of the piezoelectric thin film resonator illustrated in FIG. 9.

FIG. 10 illustrates a residual stress distribution in the vicinity of the leading part 4x of the upper electrode 4 in the piezoelectric thin film resonator illustrated in FIGS. 4 and 5, and thus illustrates a residual stress distribution in the region where the lower electrode 2, the upper electrode 4 and the cavity 6 overlap each other as illustrated in FIG. 5. FIG. 11 illustrates a residual stress distribution in the vicinity of the leading part 104x of the upper electrode 104 of the known piezoelectric thin film resonator illustrated in FIGS. 8 and 9 and thus illustrates a residual stress distribution in the region where the lower electrode 102, the upper electrode 104 and the gap 106 overlap each other as illustrated in FIG. 9. In an area pointed to by an arrow F in FIG. 11, a high residual stress is caused in the leading part 104x of the upper electrode 104 in the known piezoelectric thin film resonator, possibly leading to membrane destruction such as a broken upper electrode 104. In contract, in an area pointed to by an arrow E in FIG. 10, a low residual stress is caused in the leading part 4x of the upper electrode 4 in the piezoelectric thin film resonator of the present embodiment, and increases a margin in membrane destruction such as a broken upper electrode 4. Furthermore, as illustrated in FIG. 10, areas 2a, 4a, and 6a represent residual stresses of the lower electrode 2, the upper electrode 4, and the cavity 6, respectively. As illustrated in FIG. 11, areas 102a, 104a, and 106a represent residual stresses of the lower electrode 102, the upper electrode 104 and the opening 106, respectively.

To attain the advantages of the embodiment of the present invention, the material of each of the substrate, the electrodes, the piezoelectric film, and an additional film as needed arises is not limited to the one described above, and another material may be used for these elements.

In the discussion of the film formation in accordance with the present embodiment, only major elements in the piezoelectric thin film resonator are described. For example, dielectric films may be formed beneath the lower electrode 2 or on the upper electrode 4. The dielectric film formed beneath the lower electrode 2 may play a part, for example, as a reinforcement member or as a stop layer in etching. Furthermore, the dielectric film formed on the upper electrode 4 may play a part, for example, as a passivation layer or a frequency adjustment member.

In accordance with the present embodiment, the region of each of the lower electrode 2 and the upper electrode 4 facing each other has an elliptic shape, but may have a different shape. For example, a polygonal shape (such as a pentagon) having no parallel sides provides the same advantages.

In the discussion of the present embodiment, the cavity 6 such as an air gap formed on the major flat surface of the substrate 1 is used. A piezoelectric thin film resonator having the cavity 6 such as a via hole or a recess beneath the lower electrode 2 provides the same advantages. The cavity as an opening, beneath the lower electrode 2 may formed by dry etching the substrate 1 having the upper electrode 4, the piezoelectric film 3 and the lower electrode 2 produced thereon.

2. Second Embodiment of the Piezoelectric Thin-film Resonator

Figure 12:
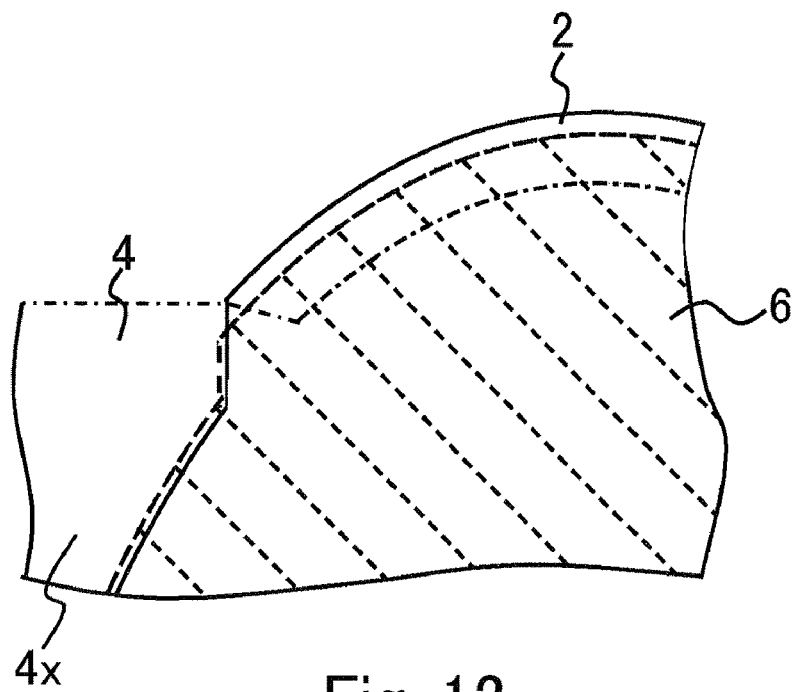
FIG. 12 illustrates a plan view showing the structure of a second embodiment of the piezoelectric thin film resonator.
Figure 13:
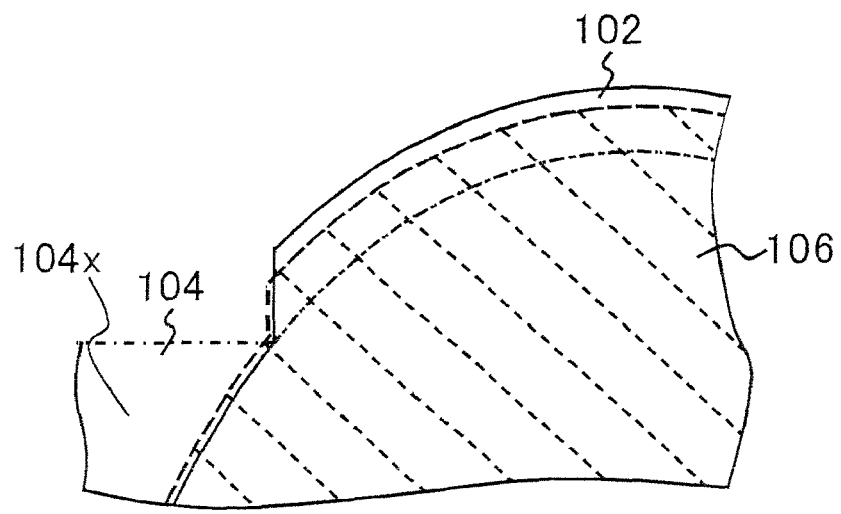
FIG. 13 illustrates a plan view of a known piezoelectric thin film resonator.
Figure 14:
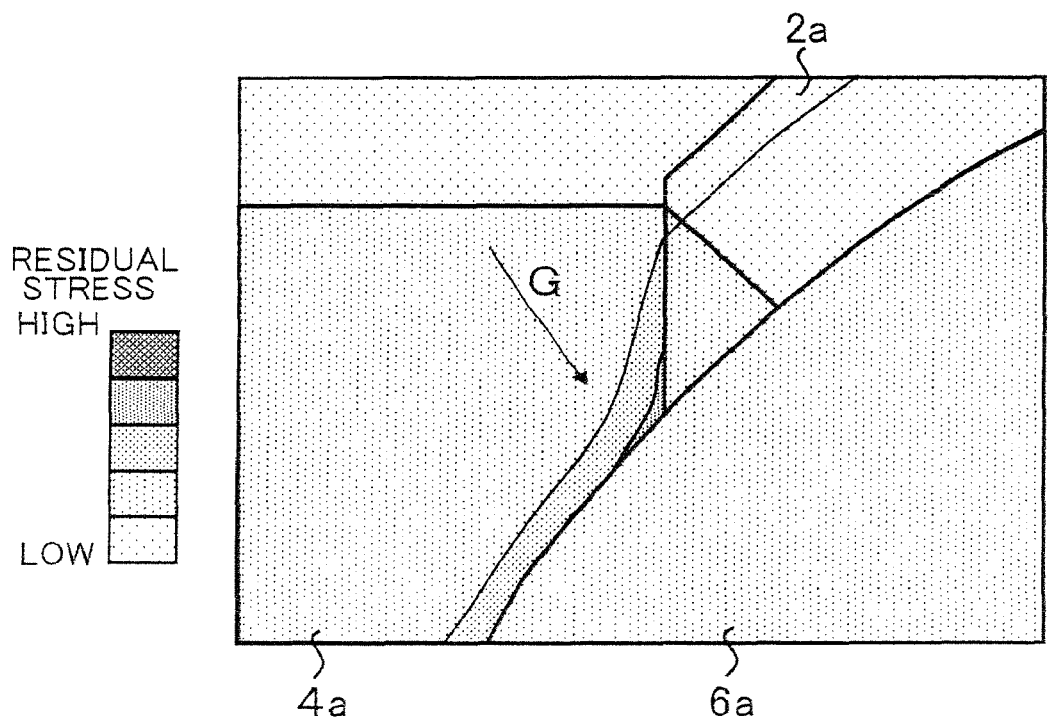
FIG. 14 illustrates a distribution chart showing a stress distribution of the piezoelectric thin film resonator illustrated in FIG. 12.
Figure 15:
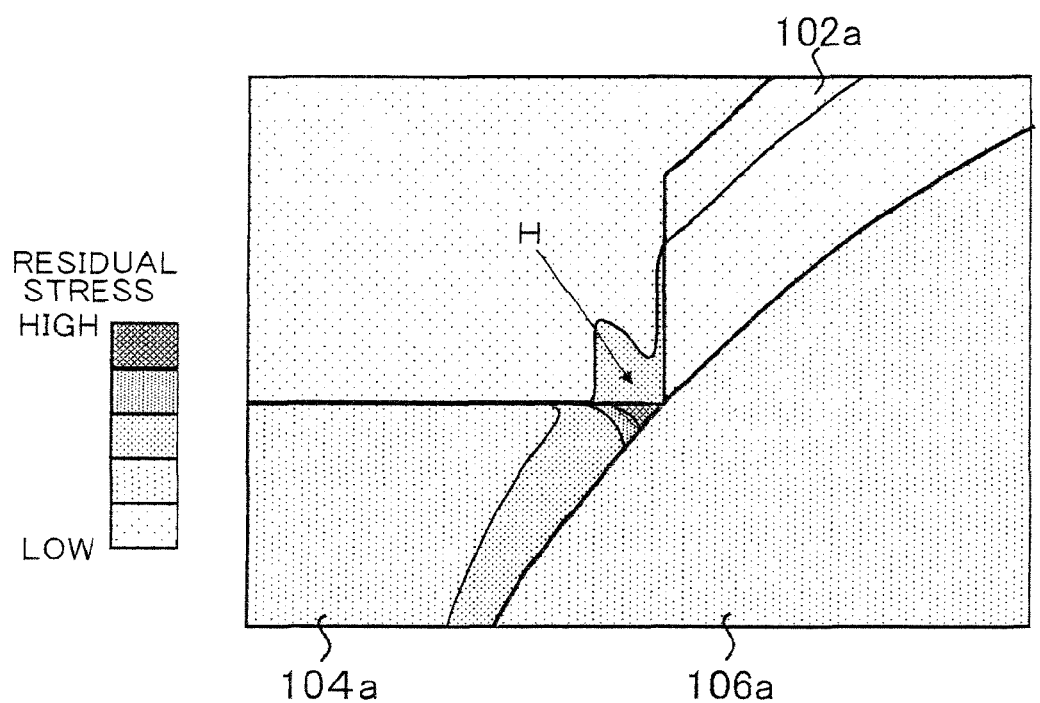
FIG. 15 illustrates a distribution chart showing a stress distribution of the piezoelectric thin film resonator illustrated in FIG. 13.

FIG. 12 is an expanded view of an area close to the leading part 4x of the upper electrode 4 in the piezoelectric thin film resonator of a second embodiment. The basic structure of the second embodiment is identical to the structure of the first embodiment illustrated in FIG. 4 and the discussion thereof is omitted here. The structure of the second embodiment has a cavity (such as an opening) different in shape from that of the structure of the first embodiment. FIG. 13 illustrates a combination of the upper electrode 104 and the lower electrode 102 of the known structure with the cavity of the present embodiment. FIGS. 14 and 15 respectively illustrate residual stress distributions of the piezoelectric thin film resonator of FIG. 12 and the piezoelectric thin film resonator of FIG. 13.

FIG. 14 illustrates a residual stress distribution of an area close to the leading part 4x of the upper electrode 4 in the piezoelectric thin film resonator of the present embodiment illustrated in FIG. 12, FIG. 15 illustrates a residual stress distribution of an area close to the leading part 104x of the upper electrode 104 of the known structure illustrated in FIG. 13. In an area pointed to by an arrow H in FIG. 15, a high residual stress is caused in the leading part 104x of the upper electrode 104 in the known piezoelectric thin film resonator, possibly leading to membrane destruction such as a broken upper electrode 104. In contrast, in an area pointed to by an arrow G in FIG. 14, a low residual stress is caused in the leading part 4x of the upper electrode 4 in the piezoelectric thin film resonator of the present embodiment, and increases a margin in membrane destruction such as a broken upper electrode 4.

The two piezoelectric thin film resonators illustrated in FIGS. 14 and 15 have the cavity widened beneath the lower electrode. Even if the overlapping portion of the lower electrode and the upper electrode and the cavity are deviated in relative positions thereof for a reason in manufacturing, no change takes place in the resonance characteristics. In this way, the productivity of the resonator is improved. The productivity is described with reference to FIGS. 16A to 16C.

Figure 16A:
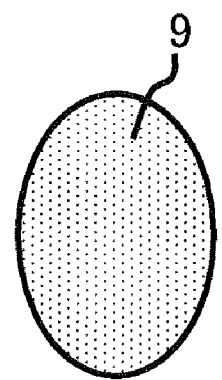
FIGS. 16A to 16C illustrate plan views showing a formation process of a sacrificial layer.
Figure 16B:
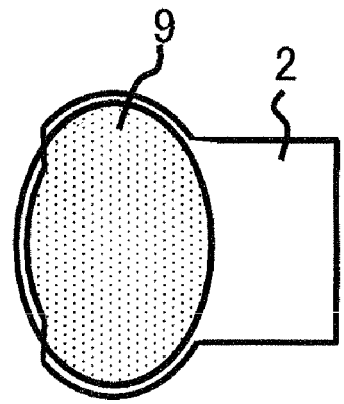
Figure 16C:
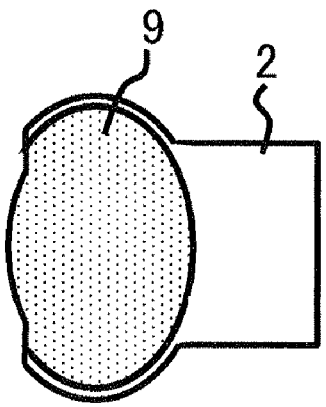

Each of FIGS. 16A to 16C is a plan view of the lower electrode 2 and the sacrificial layer 9. As illustrated in FIG. 16B, the lower electrode 2 is arranged on the sacrificial layer 9 formed on the major flat surface of the substrate 1 as shown in FIG. 16A. After the lower electrode 2 is patterned, the end shape of the lower electrode 2 (the shape of a left edge as illustrated) of the lower electrode 2 and the shape of the sacrificial layer 9 may be generally identical as illustrated in FIG. 16C. In such a case, the planar shape of the cavity at the end portion of the lower electrode 2 and the planar shape of the end portion of the lower electrode 2 becomes generally identical subsequent to the removal of the sacrificial layer 9. In each of FIGS. 16B and 16C, the cavity beneath the lower electrode 2 is larger than the region where the lower electrode and the upper electrode overlap each other. A margin in position deviation is thus increased, and the productivity is increased.

3. Structure of the Filter

Figure 17:
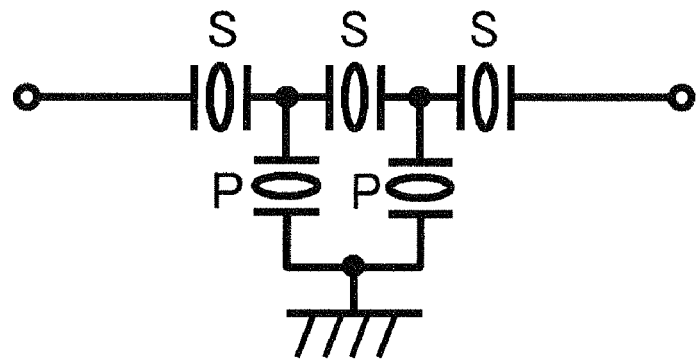
FIG. 17 illustrates a circuit diagram showing the structure of a filter according to an embodiment.

FIG. 17 is a circuit diagram illustrating the structure of a filter. The filter is a band-pass filter in which a plurality of resonators are connected in a ladder configuration, for example. In the filter illustrated in FIG. 17, a plurality of resonators S are arranged on a series arm in series each other, each of resonators P is then arranged on parallel arm, and those parallel arms are connected to the series arm. Each of the piezoelectric thin film resonators of the first embodiment and the second embodiment may be used for the resonator S or P. By setting the resonance frequency of each resonator to a desired value, a band-pass filter allowing a signal of a desired frequency to pass therethrough is provided.

The filter including the piezoelectric thin film resonator of the embodiments improves the mechanical strength while maintaining the resonance characteristics. The filter having an excellent productivity is thus provided.

In accordance with the present embodiment, a ladder-type filter is described. The present invention is applicable to a filter, such as a lattice-type filter, in which the piezoelectric thin film resonators of the embodiments are employed.

4. Structure of Communication Module

Figure 18:
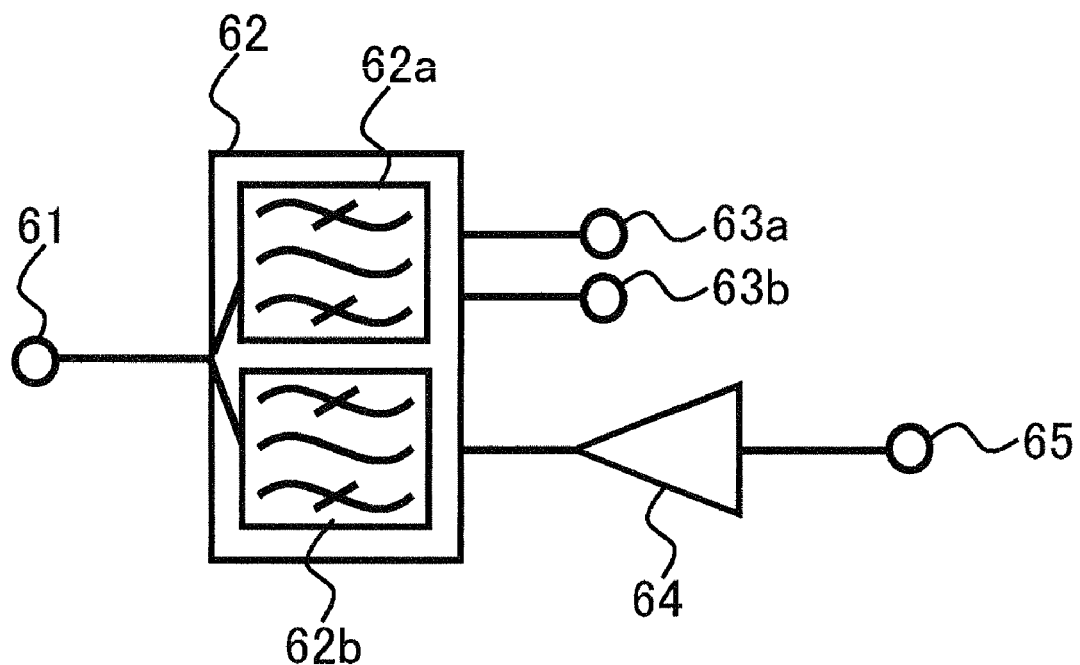
FIG. 18 illustrates a block diagram showing the structure of a communication module according to an embodiment.

FIG. 18 illustrates an example of a communication module including the piezoelectric thin film resonator or the filter in accordance with the embodiments. With reference to FIG. 18, a duplexer 62 includes a receiver filter 62a and a transmitter filter 62b. Receiver terminals 63a and 63b, for example, for a balanced output, are connected to the receiver filter 62a. The transmitter filter 62b is connected to a transmitter terminal 65 via a power amplifier 64. Here, each of the receiver filter 62a and the transmitter filter 62b includes the piezoelectric thin film resonator of the present embodiments.

In a receiving operation, the receiver filter 62a allows only a signal within a predetermined frequency band out of signals received via an antenna terminal 61 to pass therethrough, and outputs the passed signal to the outside via receiver terminals 63a and 63b. In a transmitting operation, the transmitter filter 62b allows only a signal within a predetermined frequency band out of signals input by the transmitter terminal 65 and amplified by the power amplifier 64 to pass therethrough, and outputs the passed signal to the outside via the antenna terminal 61.

With the piezoelectric thin film resonator or the filter in accordance with the present embodiments included in the receiver filter 62a and the transmitter filter 62b of the communication module, the communication module features the improved mechanical strength with the resonance characteristics maintained. The communication module excellent in productivity is thus provided.

The communication module illustrated in FIG. 18 is one example. The same advantages will be provided if the piezoelectric thin film resonator or the filter of the present embodiments is incorporated in a communication module of another embodiment.

5. Structure of Communication Apparatus

Figure 19:
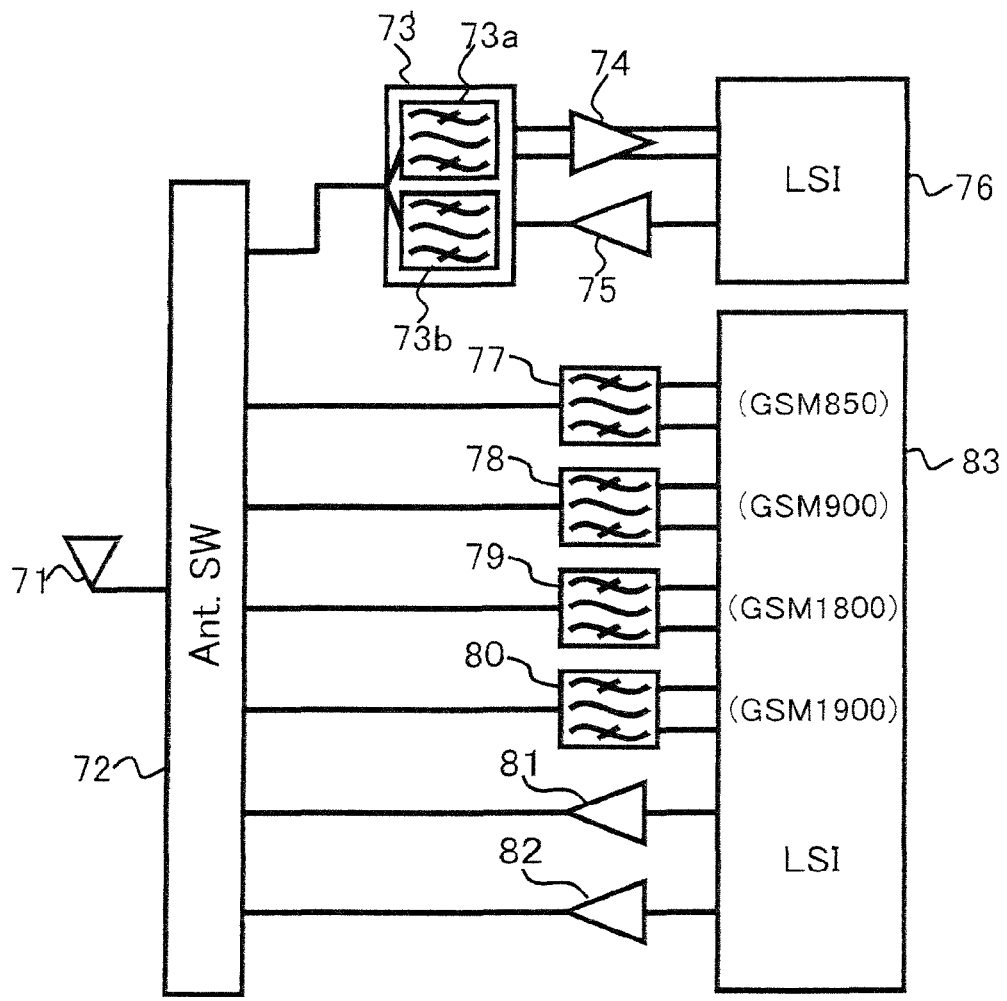
FIG. 19 illustrates a block diagram showing the structure of a communication apparatus according to an embodiment.
Figure 20:
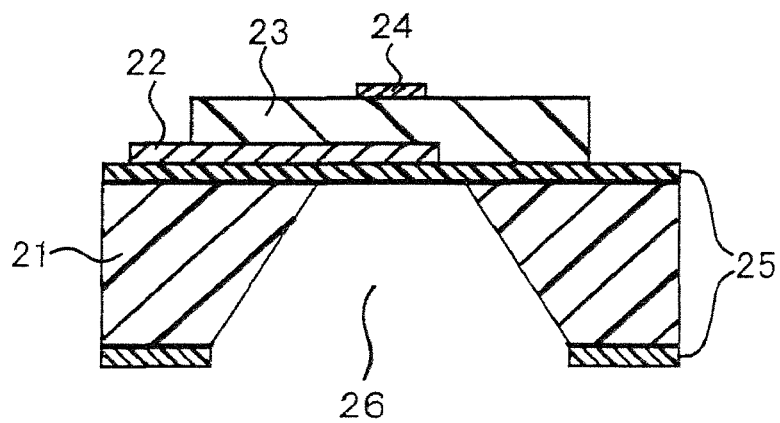
FIG. 20 illustrates a sectional view showing the structure of a known piezoelectric thin film resonator.
Figure 21:
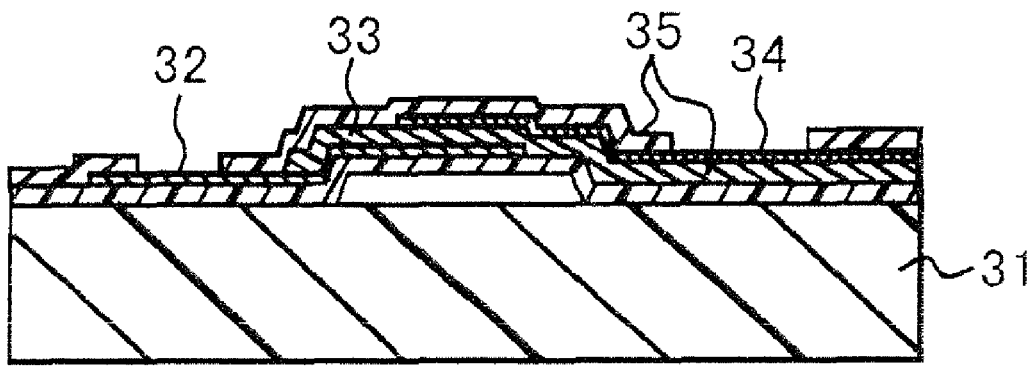
FIG. 21 illustrates a sectional view showing the structure of a known piezoelectric thin film resonator.
Figure 22:
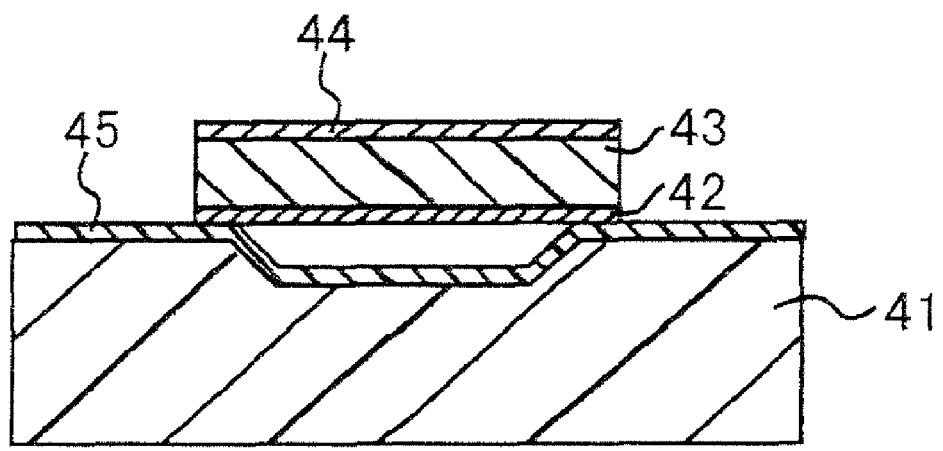
FIG. 22 illustrates a sectional view showing the structure of a known piezoelectric thin film resonator.

FIG. 19 illustrates a radio frequency (RF) block of a cellular phone or mobile phone as an example of a communication apparatus including the communication module of the present embodiments. The structure illustrated in FIG. 19 is the one for a cellular phone terminal supporting Global System for Mobile Communications (GSM) communication method and Wideband Code Division Multiple Access (W-CDMA) communication method. The GSM communication method of the present embodiment is compatible with the 850 MHz band, the 950 MHz band, the 1.8 GHz band, and the 1.9 GHz band. In addition to the structure of FIG. 19, the cellular phone terminal includes a microphone, a speaker, a liquid-crystal display, etc., but these elements are not necessary in the discussion of the present embodiment, and are thus not shown. Here, each of receiver filters 73a, 77, 78, 79, 80, and a transmitter filter 73b includes the piezoelectric thin film resonator or the filter in accordance with the present embodiments.

An antenna switch circuit 72 selects an LSI to work with depending on whether the communication method of a received signal input via an antenna 71 is W-CDMA or GSM. If the received signal is compatible with W-CDMA communication method, switching is performed so that the received signal is output to a duplexer 73. The received signal input to the duplexer 73 is limited to a predetermined frequency band by the receiver filter 73*a*, and a balanced type received signal is then output to a low noise amplifier 74 (LNA 74). The LNA 74 amplifies the input received signal and outputs the amplified signal to an LSI 76. The LSI 76 performs a demodulation process on an audio signal in response to the input received signal, and controls operation of each element in the cellular phone terminal.

On the other hand, when a signal is transmitted, the LSI 76 generates a transmission signal. The generated transmission signal is amplified by a power amplifier 75, and then input to the transmitter filter 73*b*. The transmitter filter 73*b* allows only a signal within a predetermined frequency band out of input transmission signals. The transmission signal output from the transmitter filter 73*b* is output to the outside from an antenna 71 via the antenna switch circuit 72.

If the input received signal is compatible with the GSM communication method, the antenna switch circuit 72 selects one of the receiver filters 77 to 80 in response to the frequency band, and outputs the received signal. The received signal frequency limited by one of the receiver filters 77 to 80 is input to an LSI 83. In response to the input received signal, the LSI 83 performs a demodulation process to an audio signal, and controls operation of each element in the cellular phone terminal. On the other hand, when a signal is transmitted, the LSI 83 generates a transmission signal. The generated transmission signal is amplified by one of power amplifiers 81 and 82, and the amplified signal is then output to the outside from the antenna 71 via the antenna switch circuit 72.

With one of the piezoelectric thin film resonator, the filter, and the communication module of the present embodiments incorporated in the communication apparatus, the communication apparatus features the improved mechanical strength with the resonance characteristics maintained. The communication apparatus thus has an excellent productivity.

6. Other Features of the Embodiments

In accordance with the present embodiments, the mechanical strength is increased while the resonance characteristics are improved. The piezoelectric thin film resonator, the filter, the communication module, and the communication apparatus, each featuring an excellent productivity, are provided.

The embodiments of the present invention have been discussed. The present invention is not limited to any particular embodiments, and a variety of changes and modifications are possible within the scope of the present invention recited in the claims.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A piezoelectric thin film resonator comprising:
   a substrate;
   a lower electrode formed on the substrate;
   a piezoelectric film formed on the substrate and the lower electrode; and
   an upper electrode formed on the piezoelectric film and having a main portion and an extended portion connected to the main portion, the main portion opposing the lower electrode and an opening disposed between the substrate and the lower electrode, the extended portion having a center portion which opposes the opening and the substrate, and opposed end portions which oppose the lower electrode outside the opening.

2. The piezoelectric thin film resonator according to claim 1, wherein a stress caused by laminating the lower electrode, the piezoelectric film, and the upper electrode is compressive.

3. The piezoelectric thin film resonator according to claim 1, wherein the opening forms a shape similar to a dome.

4. The piezoelectric thin film resonator according to claim 1, wherein a shape of a region at which the upper electrode and the lower electrode are opposed each other is an ellipse or a polygon of which sides are not parallel each other.

5. The piezoelectric thin film resonator according to claim 1, wherein a material of the piezoelectric film includes aluminum nitride or zinc oxide.

6. A piezoelectric thin film resonator comprising:
   a substrate having a flat surface;
   a lower electrode formed on the flat surface;
   a piezoelectric film formed on the substrate and the lower electrode; and
   an upper electrode formed on the piezoelectric film and having a main portion and an extended portion connected to the main portion, the main portion opposing the lower electrode and an opening disposed between the substrate and the lower electrode, the extended portion having a center portion which opposes the opening and the substrate, and opposed end portions which oppose the lower electrode outside the opening.

7. The piezoelectric thin film resonator according to claim 6, wherein an outside shape of the lower electrode is partially similar to an outside shape of the opening.

8. The piezoelectric thin film resonator according to claim 6, wherein the opening forms a shape similar to a dome.

9. The piezoelectric thin film resonator according to claim 6, wherein a stress caused by laminating the lower electrode, the piezoelectric film, and the upper electrode is compressive.

10. The piezoelectric thin film resonator according to claim 6, wherein a material of the piezoelectric film includes aluminum nitride or zinc oxide.

11. The piezoelectric thin film resonator according to claim 6, wherein a shape of a region at which the upper electrode and the lower electrode are opposed each other is an ellipse or a polygon of which sides are not parallel each other.

12. The piezoelectric thin film resonator according to claim 6, wherein another opening is formed from the opening to an outside of the opening.

13. A filter comprising:
   a piezoelectric thin film resonator including:
   a substrate;
   a lower electrode formed on the substrate;
   a piezoelectric film formed on the substrate and the lower electrode; and
   an upper electrode formed on the piezoelectric film and having a main portion and an extended portion connected to the main portion, the main portion opposing the lower electrode and an opening disposed between the substrate and the lower electrode, the extended portion having a center portion which opposes the opening and the substrate, and opposed end portions which oppose the lower electrode outside the opening.

14. A communication apparatus comprising:
a filter including:
a piezoelectric thin film resonator including:
a substrate;
a lower electrode formed on the substrate;
a piezoelectric film formed on the substrate and the lower electrode; and
an upper electrode formed on the piezoelectric film and having a main portion and an extended portion connected to the main portion, the main portion opposing the lower electrode and an opening disposed between the substrate and the lower electrode, the extended portion having a center portion which opposes the opening and the substrate, and opposed end portions which oppose the lower electrode outside the opening.

* * * * *